US012658867B2

(12) United States Patent
Lenz

(10) Patent No.: US 12,658,867 B2
(45) Date of Patent: Jun. 16, 2026

(54) METHOD FOR COMPENSATING FOR AN INTERNAL VOLTAGE OFFSET BETWEEN TWO INPUTS OF AN AMPLIFIER

(71) Applicant: STMicroelectronics (Alps) SAS, Grenoble (FR)

(72) Inventor: Kuno Lenz, Voreppe (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 564 days.

(21) Appl. No.: 18/116,124

(22) Filed: Mar. 1, 2023

(65) Prior Publication Data

US 2023/0283252 A1 Sep. 7, 2023

(30) Foreign Application Priority Data

Mar. 3, 2022 (FR) ...................................... 2201863

(51) Int. Cl.
H03F 3/45 (2006.01)
H03F 1/08 (2006.01)

(52) U.S. Cl.
CPC ......... H03F 3/45475 (2013.01); H03F 1/083 (2013.01); H03F 3/45973 (2013.01);
(Continued)

(58) Field of Classification Search
CPC ............. H03F 3/45475; H03F 3/45973; H03F 2200/375; H03F 1/083; H03F 2203/45212; H03F 2200/156; H03F 2200/159; H03F 2200/252; H03F 2203/45038; H03F 2203/45048; H03F 2203/45114; H03F 2203/45521; H03F 2200/15;
(Continued)

(56) References Cited

U.S. PATENT DOCUMENTS

| | | | | |
|---|---|---|---|---|
| 11,239,807 | B1 * | 2/2022 | Price ...................... | H03F 1/3205 |
| 2009/0304092 | A1 * | 12/2009 | Takemoto ........... | H03F 3/45183 |
| | | | | 375/257 |

(Continued)

FOREIGN PATENT DOCUMENTS

| | | | | |
|---|---|---|---|---|
| CN | 104412710 A | * | 3/2015 | ............. H05B 45/10 |
| DE | 102020130115 A1 | * | 5/2021 | ............. G01R 19/18 |

OTHER PUBLICATIONS

INPI Search Report and Written Opinion for priority application, FR 2201863, report dated Oct. 18, 2022, 8 pgs.

*Primary Examiner* — Andrea Lindgren Baltzell
*Assistant Examiner* — Lance Torbjorn Bartol
(74) *Attorney, Agent, or Firm* — Crowe & Dunlevy LLC

(57) ABSTRACT

An internal voltage offset between a positive input and a negative input of a first operational amplifier is compensated. The negative input and the positive input of the first operational amplifier are coupled at the same voltage level. A comparison current generated at an output of the first operational amplifier has a sign that is representative of a sign of the internal voltage offset. The output of the first operational amplifier is biased to a threshold voltage using a current-to-voltage converter. A control voltage is generated from a sum of the threshold voltage and a voltage conversion of the comparison current. Compensation for the internal voltage offset between the positive and negative inputs of the first operational amplifier is made dependent on the control voltage.

20 Claims, 4 Drawing Sheets

(52) U.S. Cl.
CPC .. *H03F 2200/156* (2013.01); *H03F 2200/159* (2013.01); *H03F 2200/252* (2013.01); *H03F 2200/375* (2013.01); *H03F 2203/45038* (2013.01); *H03F 2203/45048* (2013.01); *H03F 2203/45114* (2013.01); *H03F 2203/45212* (2013.01); *H03F 2203/45521* (2013.01); *H03F 2203/45528* (2013.01); *H03F 2203/45536* (2013.01); *H03F 2203/45616* (2013.01)

(58) Field of Classification Search
CPC . H03F 2203/45528; H03F 2203/45536; H03F 2203/45616
USPC ...................................... 330/252, 9; 327/307
See application file for complete search history.

(56) References Cited

U.S. PATENT DOCUMENTS

| | | | |
|---|---|---|---|
| 2010/0213983 A1 | 8/2010 | Eschauzier et al. | |
| 2021/0110779 A1* | 4/2021 | Wang ................... | G09G 3/3648 |

* cited by examiner

METHOD FOR COMPENSATING FOR AN INTERNAL VOLTAGE OFFSET BETWEEN TWO INPUTS OF AN AMPLIFIER

PRIORITY Claim

This application claims the priority benefit of French Application for Patent No. 2201863, filed on Mar. 3, 2022, the content of which is hereby incorporated by reference in its entirety to the maximum extent allowable by law.

TECHNICAL FIELD

Embodiments and implementations relate to the calibration of an operational amplifier circuit.

BACKGROUND

An operational amplifier allows carrying out an operation between different signals of an integrated circuit, in particular a very high gain amplification (typically in the range of 100 to 1000). During calibration, the amplifier feedback is typically deactivated and the open loop amplifier operates as a comparator.

A voltage level is generated at the output of the amplifier when voltages are applied to the inverting input and non-inverting input of the amplifier. In particular, the voltage level varies according to the sign of the deviation between the input voltages when the amplifier is used as a comparator. In other words, a first voltage level is generated for a positive deviation and a second voltage level is generated for a negative deviation. The deviation is positive when the voltage applied to the non-inverting input is greater than the voltage applied to the inverting input of the amplifier and is negative otherwise.

In order to produce a voltage level from the input voltages, the amplifier generally comprises several stages internally formed by analog circuits, in particular a differential input stage.

The differential input stage typically provides internal elements distributed over two branches for each input of the amplifier and transmits the voltage deviation between the inputs to the other stages of the amplifier.

The internal elements are analog components, such as transistors for example, which are controlled by the voltages applied to each input of the amplifier. These elements are typically selected to have identical characteristics between the two branches such that the voltage produced by the differential stage is representative of the actual voltage deviation between the inputs of the amplifier.

Nevertheless, the features of the internal elements may be different due to physical hazards of the manufacturing processes (for example, process variation) and/or divergence over time. A difference between these characteristics results in an internal voltage offset between the inputs of the amplifier. This voltage offset, usually called "offset voltage" is likely to change the sign of the deviation between the input voltages. The output voltage of the differential stage is then expressed as being the actual deviation between the input voltages to which the offset voltage is added.

Consequently, the amplifier may output a voltage level which does not correspond to the voltage level associated with the actual deviation between the input voltages.

In order to compensate for this offset voltage, the operational amplifier can be calibrated. During calibration, it is typically appropriate to isolate the operational amplifier from the rest of the integrated circuit and to short-circuit the inputs of the operational amplifier.

In this manner, the amplifier operates as a comparator and it is possible to maintain a zero actual deviation between the voltages applied at the input of the amplifier, such that only the offset voltage has an effect on the output of the amplifier.

The voltage produced by the differential stage is then only expressed depending on the voltage offset between the inputs of the first amplifier (that is to say the offset voltage) and the first amplifier generates a first or second voltage level according to the sign of the offset voltage.

A conventional calibration phase comprises a comparison of the output signal of the first amplifier with a threshold and a compensation for the offset voltage of the first amplifier. The compensation for the offset voltage made by conventional techniques comprises for example the addition of a compensation current in one of the differential branches of the first amplifier, of sign corresponding to the offset.

The voltage offset compensation can be detected during the transition between one of the voltage levels to the other voltage level, that is to say when the sign of the offset changes (i.e., when the offset voltage is zero). This transition is detected thanks to the threshold which is defined at a voltage level between the two voltage levels which can be generated by the first amplifier.

Nevertheless, the transition time between the voltage levels generated by the first amplifier is long, due to the output current of the first amplifier being very low to produce an output voltage by capacitive charge on the output node. The capacitive value on the output node can, for example, originate from parasitic capacitances in the output stage of the first amplifier and/or from frequency compensating capacitors typically placed at the output of the first amplifier, in order to ensure the stability of the output signal of the closed-loop amplifier.

Consequently, the transition detection time is long and the calibration phase takes a significant amount of time, which delays the start-up phase of the integrated circuit.

Thus, there is a need to propose solutions to this problem.

SUMMARY

Implementations and embodiments propose a calibration circuit that will allow for accelerating the method for calibrating a first amplifier within an integrated circuit.

According to one aspect, a method is proposed for compensating for an internal voltage offset between a positive input and a negative input of a first amplifier.

The method comprises coupling the negative input and the positive input of the first amplifier to the same voltage level, so as to generate a comparison current on an output of the first amplifier. The sign of the comparison current is representative of the sign of the internal voltage offset on the inputs of the first amplifier.

The method comprises biasing the output of the first amplifier to a threshold voltage, with a current-to-voltage converter, and the generation of a control voltage with the current-to-voltage converter comprising the sum of the threshold voltage and a voltage conversion of the comparison current.

And the method further comprises compensating for the internal voltage offset between the inputs of the first amplifier, depending on the control voltage.

The biasing of the output of the first amplifier to the threshold voltage allows for one to "pre-charge" the parasitic capacitances at the output of the first amplifier to the reference voltage, such that it is not the comparison current, of low intensity, which slowly charges parasitic capaci-
tances. In other words, the time necessary for charging the
parasitic capacitances by the comparison current is elimi-
nated, which allows for reducing the duration of the cali-
bration phase.

Thus, a change of sign of the output current, resulting
from a change of sign of the offset voltage between the
inputs of the first amplifier, is converted into the respective
voltage component in the control voltage. Consequently, the
level of the control voltage at the output of the current-to-
voltage converter switches very quickly, without time for
charging said parasitic capacitances, in order to control the
offset compensation.

Consequently, the transition of the control voltage is much
faster than a conventional transition of large amplitude
between the voltage levels "0" or "1" generated at the output
of the first amplifier and the threshold voltage, by capacitive
charging with low-intensity output current.

According to one embodiment, the method further com-
prises controlling a trigger element with the control voltage,
the trigger element generating a trigger signal which may
have two levels and switching to said threshold voltage, the
compensation of the internal offset between the inputs of the
first amplifier being performed until the switching of the
trigger signal.

The trigger element allows for automatically detecting a
transition of the control voltage at a specific time from which
the voltage offset is compensated.

According to one embodiment, compensating the internal
offset between the inputs of the first amplifier comprises
generating a compensation signal gradually and in steps
successively clocked by cycles of a clock signal, the com-
pensation signal being transmitted to the first amplifier and
configured to compensate for the internal voltage offset
between the inputs of the first amplifier.

A clocking of the compensation signal allows for gradu-
ally changing the internal voltage offset between the inputs
of the first amplifier and preventing the compensation signal
from having a value which is too low or too high to correctly
compensate for the voltage offset.

According to one implementation, the generation of the
compensation signal evolves gradually by an increase at
each step if the difference between the control voltage and
the threshold voltage is indicated by a first sign, or by a
decrease at each step if the difference between the control
voltage and the threshold voltage is indicated by a second
sign which is opposite to the first sign.

The calibration method can therefore be made responsive
to the sign of the voltage offset and gradually adjust the
compensation signal in order to limit the offset.

According to one implementation, the duration of the
cycles of the clock signal is set according to the time of
voltage conversion of said comparison current during a
change of sign of the comparison current.

Indeed, each cycle of the clock signal advantageously has
a duration corresponding at least to the time necessary for
the transition in the control signal caused by an offset
compensation. However, given that in the method according
to the aspect defined above, the transition is faster than in the
conventional techniques, the duration of each clock cycle is
advantageously reduced accordingly. Furthermore, the total
duration of a calibration phase corresponding to the accu-
mulation of the timing durations until offset compensation is
reduced in proportion to a factor equal to the number of
cycles for the implementation thereof.

According to one implementation, biasing the output of
the first amplifier with the current-to-voltage converter comprises applying a reference voltage to a non-inverting input
of a second operational amplifier and a resistive feedback
between the output and an inverting input of the second
operational amplifier so as to bias the output of the first
amplifier to the reference voltage.

This implementation corresponds to an advantageous
example in terms of response time of the current-to-voltage
conversion, stability of the bias of the output of the first
amplifier, and furthermore in terms of cost and size.

According to another aspect, an integrated circuit is also
proposed comprising a first amplifier and a circuit for
compensating for an internal voltage offset between a posi-
tive input and a negative input of the first amplifier.

The compensation circuit comprises a switching circuit
configured to couple the negative input and the positive
input of the first amplifier to the same voltage level, such that
the first amplifier is configured to generate a comparison
current on an output of the first amplifier, the sign of the
comparison current being representative of the sign of an
internal voltage offset on the inputs of the first amplifier.

The compensation circuit comprises a current-to-voltage
converter circuit configured to bias the output of the first
amplifier to a threshold voltage and to generate a control
voltage comprising the sum of the threshold voltage and a
voltage conversion of the comparison current.

The compensation circuit is further configured to generate
a signal for compensating for the internal voltage offset
between the inputs of the first amplifier, depending on the
difference between the control voltage and the threshold
voltage.

According to one embodiment, the compensation circuit
comprises a trigger element configured to generate a trigger
signal which may have two levels and which is controlled by
the control voltage and to switch to said threshold voltage,
the compensation circuit being configured to generate said
compensation signal until the switching of the trigger signal.

According to one embodiment, the compensation circuit
is further configured to receive a clock signal and generate
a compensation signal gradually and in steps successively
clocked by cycles of the clock signal, and to transmit to the
first amplifier the compensation signal configured to com-
pensate for the internal voltage offset between the inputs of
the first amplifier.

According to one embodiment, the compensation circuit
is configured to generate said compensation signal evolving
gradually by an increase at each step if the difference
between the control voltage and the threshold voltage has a
first sign, or by a decrease at each step if the difference
between the control voltage and the threshold voltage has a
second sign opposite to the first sign.

According to one embodiment, the compensation circuit
is configured to be clocked by cycles of the clock signal
having a duration which is set according to the time of
voltage conversion of said comparison current during a sign
change of the comparison current.

According to one embodiment, the current-to-voltage
converter comprises a second operational amplifier and
further comprises a feedback resistor between the output and
an inverting input of the second operational amplifier, and a
voltage source applying a reference voltage to the non-
inverting input of the second operational amplifier so as to
bias the output of the first amplifier to the threshold voltage.

BRIEF DESCRIPTION OF THE DRAWINGS

Other advantages and features of the invention will appear
on examining the detailed description of embodiments and
implementations, without limitation, and of the appended
drawings, in which.

DETAILED DESCRIPTION

Figure 1:
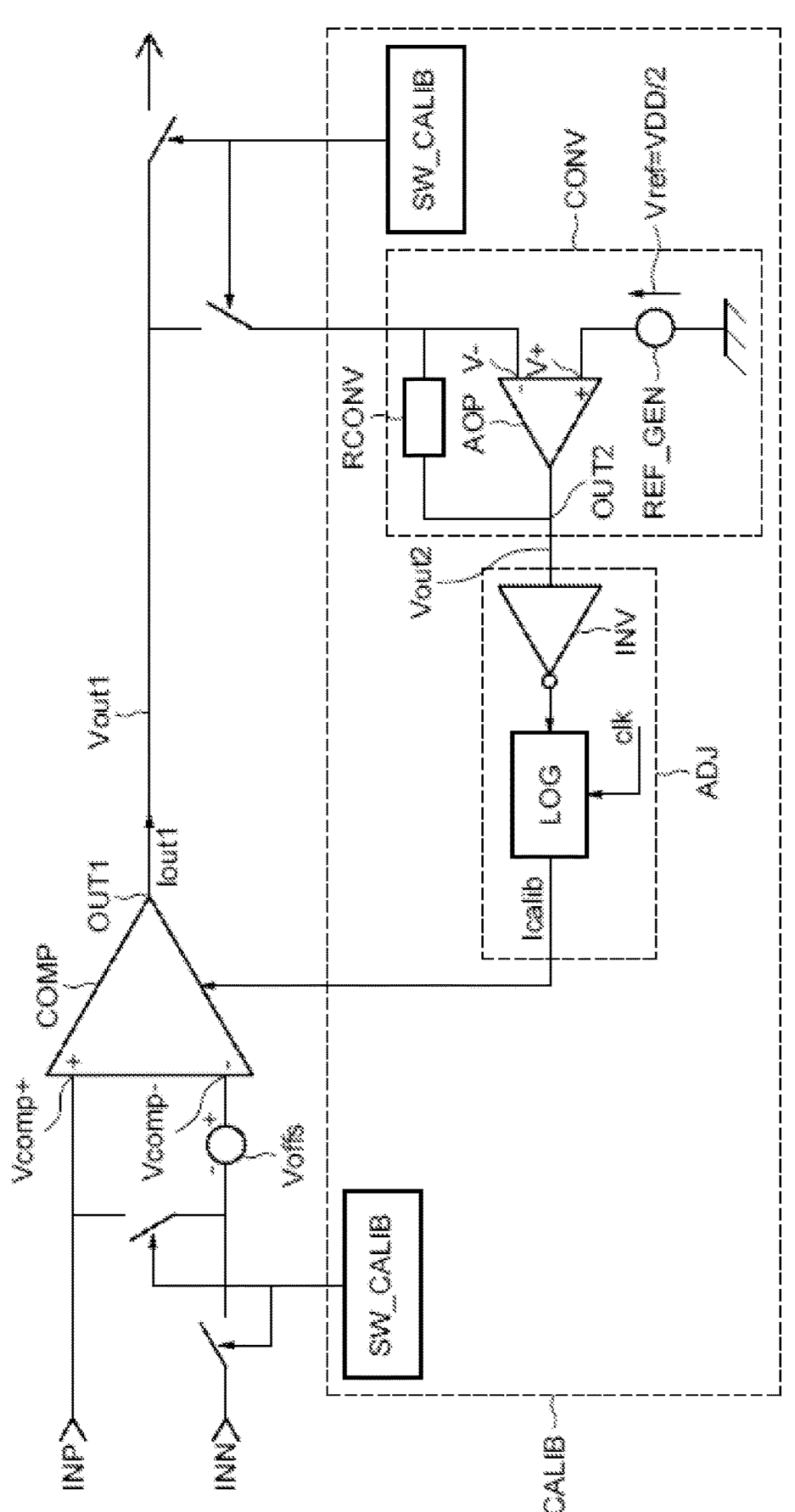
FIG. 1 illustrates an integrated circuit.

FIG. 1 illustrates an integrated circuit according to an embodiment. The integrated circuit comprises a first amplifier COMP and a calibration circuit CALIB.

The first amplifier COMP is an operational amplifier which comprises a positive input Vcomp+, a negative input Vcomp− and an output OUT1.

Such an operational amplifier typically has an internal voltage offset Voffs between the inputs Vcomp+ and Vcomp−, in a conventional manner and known to the person skilled in the art. The internal voltage offset Voffs is modeled herein as a voltage source placed on the negative input Vcomp− of the first amplifier COMP and such voltage source is not present in practice.

The positive input Vcomp+, the negative input Vcomp− and the output OUT1 of the first amplifier COMP can be connected to a circuit belonging to the rest of the integrated circuit, not represented in FIG. 1, when the first amplifier COMP is not in the calibration phase.

The calibration circuit CALM comprises a switching circuit SW_CALIB, a current-to-voltage converter circuit CONV and a compensation circuit ADJ.

The switching circuit SW_CALIB is configured to couple the negative input Vcomp− with the positive input Vcomp+ in the calibration phase. The negative input Vcomp− and the positive input Vcomp+ of the first amplifier COMP are thus at the same voltage level in the calibration phase, and consequently the amplifier COMP operates as a comparator during the calibration phase.

It is possible, for example, to provide a switch placed between the negative input Vcomp− and the positive input Vcomp+ allowing short-circuiting the inputs of the first amplifier COMP when the switch is activated by the switching circuit SW_CALIB in order to obtain the same voltage level between the inputs of the first amplifier COMP. A switch can also be placed on an input of the first amplifier COMP and be controlled by the switching circuit SW_CAIB in order to isolate the inputs of the first amplifier COMP from the rest of the integrated circuit during the calibration phase.

Given that the inputs Vcomp− and Vcomp+ of the first amplifier COMP are coupled to the same voltage level, the first amplifier COMP reacts only to an input voltage corresponding to the voltage offset Voffs between the inputs Vcomp− and Vcomp+. Consequently, the first amplifier COMP tends to impose on the output OUT1 a comparison voltage, usually designated "0" or "1", corresponding to the sign of the difference perceived between the inputs. A comparison current Iout1 therefore flows on the output OUT1 due to the parasitic capacitive elements present on the output node OUT1. The intensity of the comparison current Iout1 is relatively small to charge the parasitic capacitance of the output node OUT1, and the variation of the voltage Vout1 on the output node OUT1 is relatively slow. The sign of the comparison current Iout1 is therefore representative of the sign of the internal voltage offset Voffs on the inputs Vcomp− and Vcomp+ of the first amplifier COMP.

The current-to-voltage converter CONV comprises a second operational amplifier AOP and a feedback resistor RCONV. The feedback resistor RCONV is placed between the output OUT2 and an inverting input V− of the second operational amplifier AOP. The inverting input V− of the second operational amplifier AOP is connected to the output OUT1 of the first amplifier COMP.

The current-to-voltage converter also comprises a voltage source REF_GEN connected to the non-inverting input V+ of the second operational amplifier AOP. The voltage source REF_GEN applies a reference voltage Vref to the non-inverting input V+ of the second operational amplifier AOP. Due to the resistive feedback RCONV of the output OUT2 on the inverting input V−, the voltage of the non-inverting input V+ is imposed on the inverting input V− of the second operational amplifier AOP.

Thus, the reference voltage Vref is imposed on the output node OUT1 of the first amplifier COMP by the current-to-voltage converter CONV, that is to say Vout1=Vref.

On the other hand, the current-to-voltage converter CONV generates a control voltage Vout2 on the output OUT2 of the second operational amplifier AOP, which is equal to the sum of the reference voltage Vref applied to the non-inverting input V+ and the conversion voltage across the terminals of the feedback resistor RCONV. The conversion voltage across the terminals of the feedback resistor RCONV is generated by the flow of the comparison current Iout1 from the output OUT1 of the first amplifier COMP.

Figure 3:
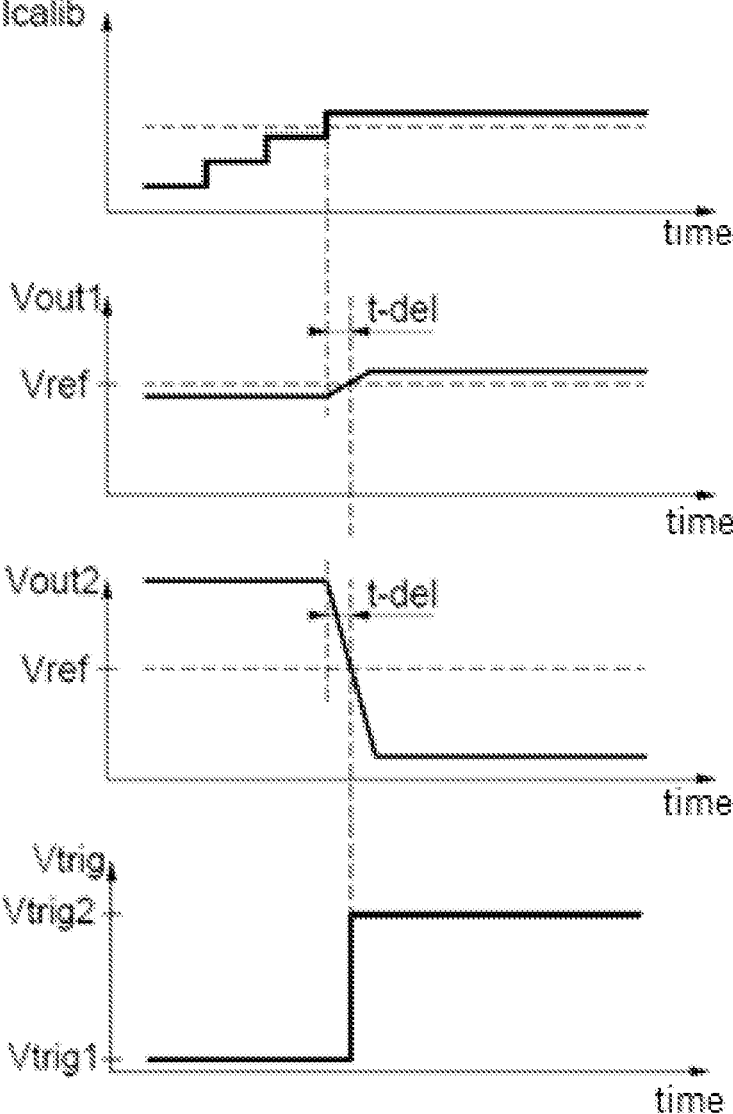
FIG. 3 graphically illustrates a timing diagram for circuit operation.

Strictly speaking, and in a manner which is known to those skilled in the art and conventional in current-to-voltage converters, it is necessary to add to the output voltage Vout1 a component equal to the conversion voltage (across the terminals of the feedback resistor RCONV) divided by the gain of the second operational amplifier AOP. For an infinite ideal gain, this component is zero. In practice, this component is very small (as represented in FIG. 3 described below) and is considered negligible.

In other words, the current-to-voltage converter CONV is configured, on the one hand, to impose the reference voltage Vref on the output OUT1 of the amplifier COMP, and on the other hand, to generate a control voltage Vout2 comprising the sum a voltage conversion of the comparison current Iout1*RCONV and of the reference voltage Vref.

The sign of the current Iout1 is duly taken into account in said sum, such that a positive current flowing from the output node OUT1 of the amplifier COMP towards the resistive element RCONV produces a conversion voltage Iout1*RCONV of negative influence on the output voltage Vout2 of the second operational amplifier AOP.

The current-to-voltage converter CONV can advantageously be configured to have an output having very low parasitic capacitance, and be optimized to have a fast current-to-voltage conversion speed. On the other hand, the conversion voltage Iout1*RCONV between the terminals of the resistor RCONV is configured to be small enough not to generate variations on the input V− outside the operating range of the second amplifier AOP.

The reference voltage Vref is advantageously selected to be equal to the threshold voltage of a trigger element INV which will be described later. The compensation circuit ADJ is configured to generate a compensation signal Icalib adapted to compensate for the internal voltage offset Voffs between the inputs of the first amplifier Vcomp+ and Vcomp−. The compensation signal Icalib is generated depending on the difference between the control voltage Vout2 and the threshold voltage Vref, in particular with regard to the positive or negative orientation of the compensation.

The compensation circuit ADJ includes a trigger element INV and a logic circuit LOG. The trigger element INV is connected to the output OUT2 of the second operational amplifier AOP and is configured to generate a trigger signal Vtrig when the voltage on the output OUT2 exceeds the threshold voltage Vref mentioned above. The logic circuit LOG is connected to the output of the trigger element INV and to the first amplifier COMP.

Figure 2:
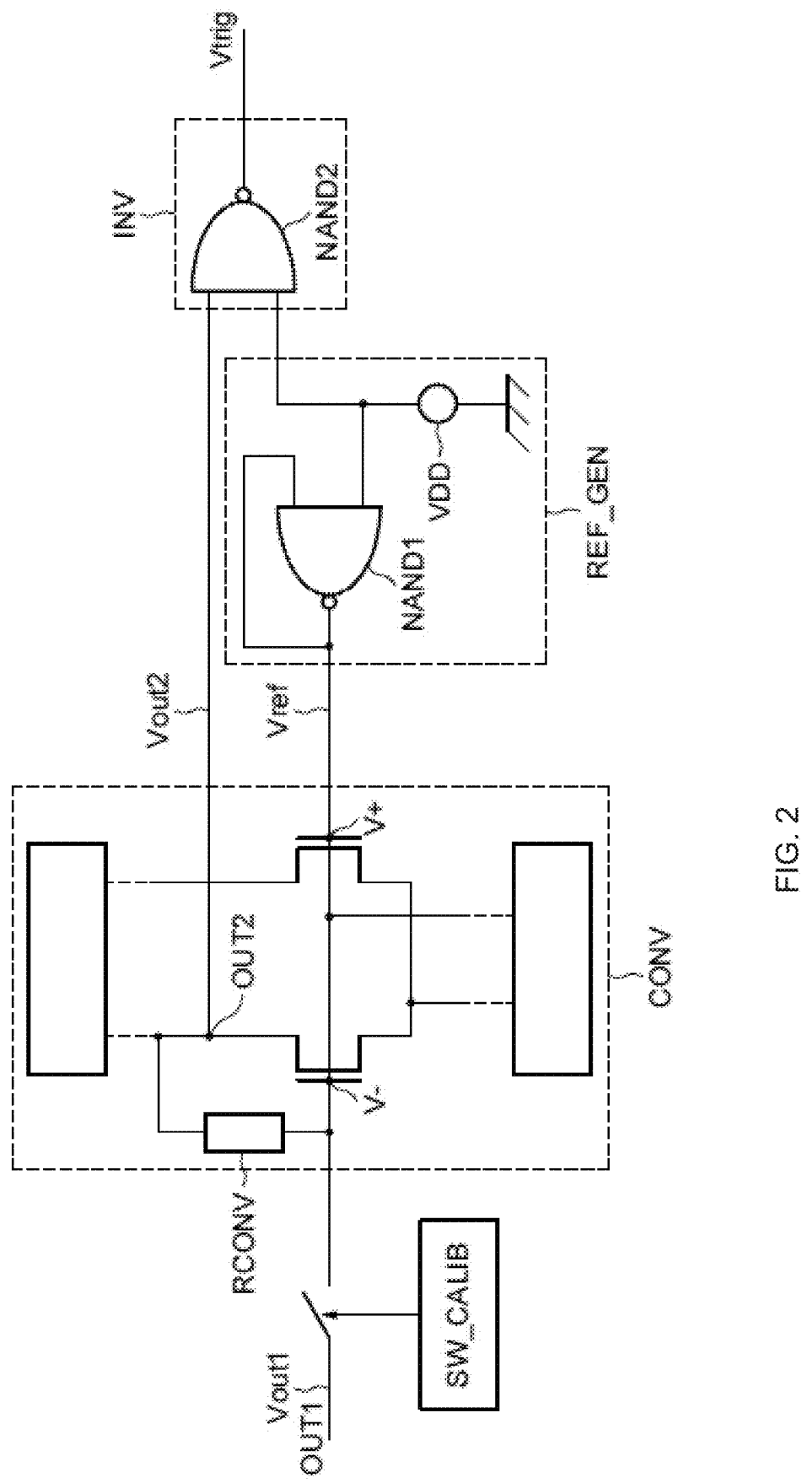
FIG. 2 schematically illustrates an example of a current-to-voltage converter and a trigger element which can be used in a calibration circuit.

FIG. 2 schematically illustrates an example of current-to-voltage converter and trigger element INV which can be used in the calibration circuit CALIB.

The voltage source REF_GEN and the trigger element INV can each include a "NAND" logic gate. The first logic gate NAND1 of the voltage source REF_GEN has an input and an output connected together and another input on which a voltage, corresponding to a logic level '1' generated by a voltage generator VDD, is applied. The second logic gate NAND2 of the trigger element INV has an input connected to the output OUT2 of the second operational amplifier AOP and another input on which a voltage, corresponding to a logic level '1' generated by the voltage generator VDD, is applied.

Thus, on the one hand, the first logic gate NAND1 is connected in an indeterminate logic state which reaches an equilibrium by generating the reference voltage Vref specifically at the value of its threshold voltage.

Alternatively, the first logic gate generating the reference voltage Vref can be obtained by an inverter whose output is looped back to the input. However, a "NAND" gate NAND1 can advantageously be controlled on the other input (not looped back from the output) with a deactivation signal at the logic level "0" (for example via a switch circuit not shown in FIG. 2), so as not to consume any current at all when the calibration circuit is switched off.

On the other hand, the second logic gate NAND2 is connected as an inverter and is capable of generating a trigger signal Vtrig. The logic value generated at the output of the second logic gate NAND2 corresponds to an inverse logic level of the value transmitted by the output OUT2 of the second operational amplifier AOP.

Moreover, the first logic gate NAND1 and the second logic gate NAND2 are advantageously matched, that is to say manufactured by the same steps of the method, with the same characteristics and dimensions, and in the same locality of the integrated circuit. Consequently, the first logic gate NAND1 and the second logic gate NAND2 have specifically the same threshold voltage taking into account the physical hazards of the manufacturing method.

The trigger signal Vtrig has a logic level determined by the difference between the control voltage Vout2 and the threshold voltage Vref of the logic gates NAND1, NAND2.

A control voltage Vout2 which is greater than the threshold voltage Vref, corresponding for example to the logic level '1', generates a trigger signal Vtrig of a first logic level Vtrig1, for example the logic level '0'. A control voltage Vout2 which is lower than the threshold voltage Vref, corresponding for example to logic level '0', generates a trigger signal Vtrig of a second logic level Vtrig2, for example the logic level '1'.

FIG. 3 graphically illustrates the evolution of the compensation signal Icalib, the output voltage Vout1 of the first amplifier COMP, the control voltage Vout2 at the output of the second amplifier AOP, and the trigger signal Vtrig over time for a negative internal voltage offset between the inputs of the first amplifier.

The compensation circuit ADJ is configured to generate and transmit the compensation signal Icalib to the first amplifier COMP. The compensation signal Icalib can be a current generated and transmitted to the first amplifier COMP by the logic circuit LOG, and configured to compensate for the internal voltage offset between the inputs Vcomp− and Vcomp+ of the first amplifier COMP. The compensation current Icalib can be used, for example, to bias a current flowing in the differential input branches of the first amplifier COMP to compensate for the voltage offset Voffs in a manner which is conventional and known to the person skilled in the art.

The output voltage Vout1 of the amplifier COMP is imposed at the reference voltage Vref, nevertheless shifted by the component mentioned above equal to the conversion voltage divided by the gain of the second operational amplifier AOP. This component is negligible and varies very little such that the parasitic capacitances on the output node OUT1 are charged very quickly and the duration t-Del of a transition of the output OUT1 by the effect of the compensation signal Icalib is very short.

The control voltage Vout2 at the output of the second operational amplifier AOP is centered on the level of the reference voltage Vref and offset by the conversion voltage Iout1*RCONV, taking into account the sign of the current Iout1, Vout2=Vref+(−Iout1)*RCONV can be expressed. Indeed, the current Iout1 leaving the amplifier COMP has a negative sign in the example illustrated by FIG. 3 (negative internal voltage offset Voffs).

The trigger element INV is configured to be controlled by the control voltage Vout2 and to switch to the threshold voltage Vref. In particular, the switching of the trigger element INV is performed when the control voltage Vout2 reaches the threshold voltage Vref and the trigger signal Vtrig passes from the first logic level Vtrig1 to the second logic level Vtrig2.

The compensation circuit ADJ is further configured to stop generating the compensation signal Icalib when the trigger signal Vtrig switches, that is to say when the comparison current Iout1 has changed sign, and therefore when the offset Voffs is compensated.

Advantageously, the compensation circuit ADJ is configured to gradually generate the compensation signal Icalib in a clocked manner by a clock signal Clk. The logic circuit LOG can, for example, generate the compensation signal Icalib gradually and in steps successively clocked by cycles of the clock signal Clk. This allows for a modification gradually approaching the value which will compensate for the offset Voffs. The graduation of each step can be constant, for example in a simple step-by-step approach, or can decrease at each step, for example in a dichotomy approach.

The cycles of the clock signal Clk advantageously have a duration which is set according to the time t-Del of voltage conversion of the comparison current Iout1*RCONV during a change of the sign of the comparison current Iout1, that is to say during a switch of the control voltage Vout2.

As a consequence of the speed of detection of the change of sign of the comparison current Iout1 obtained by the calibration circuit CALIB, previously mentioned in relation to FIGS. 1 and 2, the duration of each clocking cycle as well as the total duration of the calibration phase are reduced.

Figure 4:
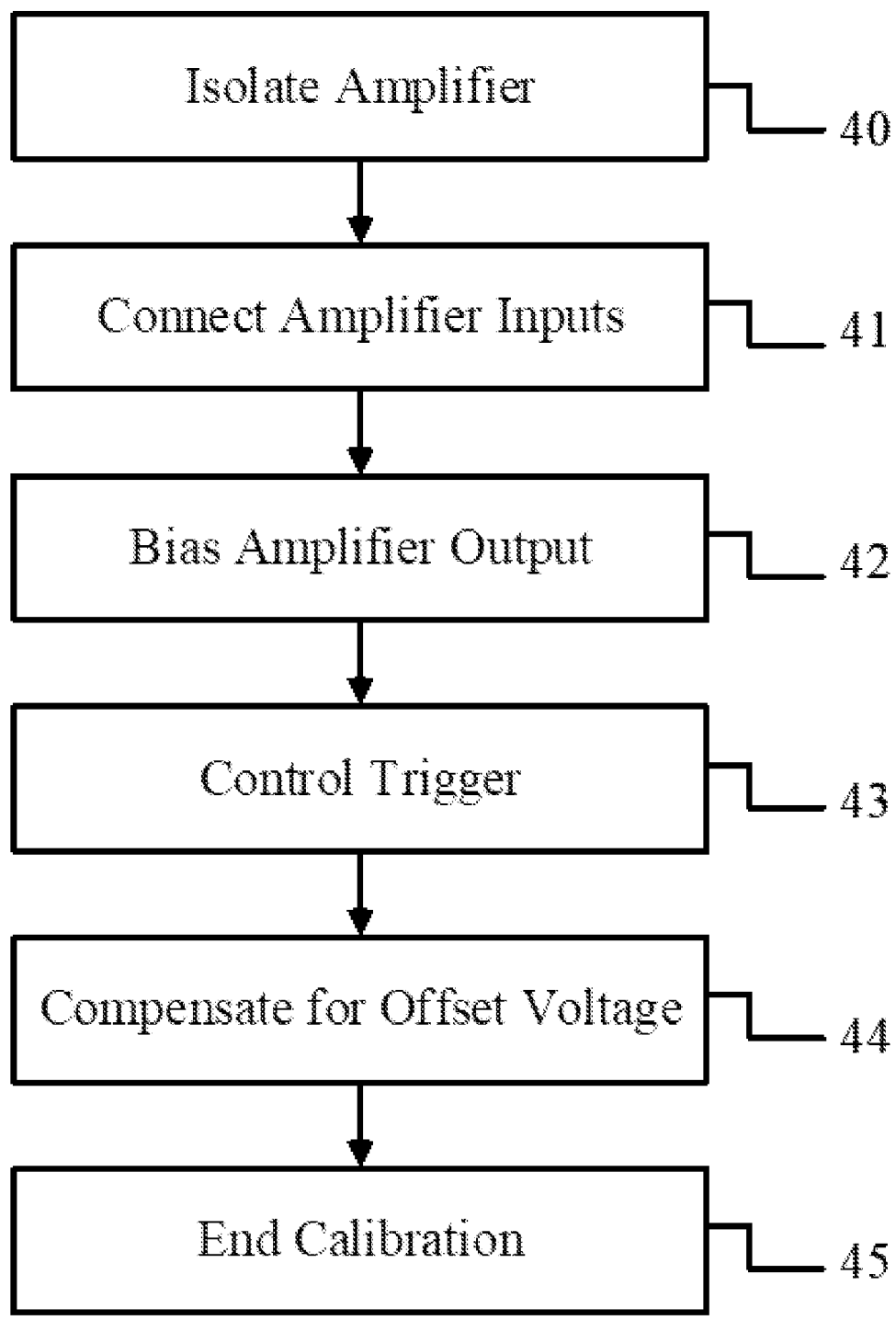
FIG. 4 illustrates an example of a method for compensating for an offset between inputs of an amplifier.

FIG. 4 illustrates an example of a method for compensating for the offset between the inputs of a first amplifier as previously described in relation to FIGS. 1 to 3.

The offset compensation method is, in particular, implemented during a calibration phase of the first amplifier COMP. The calibration phase occurs before the start-up phase of the integrated circuit and allows, in particular, the compensation of the internal voltage offset between the inputs thereof.

In step 40 of the method, the switching circuit SW_CALIB controls switches which are placed at the input and output of the operational amplifier in order to isolate it from the rest of the integrated circuit. The operational amplifier then operates as a comparator throughout the calibration phase.

The method comprises a step 41 of coupling the negative input Vcomp– and the positive input Vcomp+ of the first amplifier COMP to the same voltage level. In order to couple the respective inputs of the first amplifier COMP, the switching circuit SW_CALIB controls a switch placed between the two inputs Vcomp– and Vcomp+ and short-circuits these inputs. In this manner, a comparison current Iout1 is generated on an output of the first amplifier OUT1. The sign of the comparison current is representative of the sign of the internal voltage offset Voffs on the inputs of the first amplifier Vcomp+ and Vcomp–.

The method comprises a step 42 of biasing the output OUT1 of the first amplifier to a threshold voltage Vref with a current-to-voltage converter CONV.

In this step 42, a reference voltage Vref is applied to a non-inverting input V+ of the second operational amplifier AOP. The comparison current Iout1 is transmitted to an inverting input V– of the operational amplifier and is converted into voltage by a resistive feedback RCONV carried out between the output OUT2 and the inverting input V– of the second operational amplifier AOP. The method comprises a step 43 of controlling a trigger element INV with the control voltage Vout2. A trigger signal is generated by the trigger element INV which switches to the threshold voltage Vref. A level trigger signal Vtrig1 is generated when the control voltage Vout2 is lower than the threshold voltage Vref and a level trigger signal Vtrig2 is generated in the opposite case.

The method comprises a step 44 of compensating for the internal voltage offset Voffs between the inputs Vcomp– and Vcomp+ of the first amplifier COMP depending on the control voltage Vout2 and the threshold voltage Vref.

A compensation signal Icalib is generated gradually and in steps and transmitted to the first amplifier COMP. The compensation signal Icalib is successively clocked by cycles of a clock signal Clk and is adapted to compensate for the internal voltage offset Voffs between the inputs Vcomp– and Vcomp+ of the first amplifier COMP.

Advantageously, the duration of the cycles of the clock signal Clk is set according to the time t-Del of voltage conversion of the comparison current Iout1 during a change of sign of the comparison current Iout1.

As illustrated by FIG. 3, the compensation signal Icalib increases at each step if the difference between the control voltage Vout2 and the threshold voltage Vref is negative, that is to say during the generation of a trigger signal Vtrig of level Vtrig1. However, the compensation signal Icalib decreases at each step if the difference between the control voltage Vout2 and the threshold voltage Vref is positive, that is to say during the generation of a trigger signal Vtrig of level Vtrig2.

The offset compensation Voffs is performed until the Vtrig trigger signal is switched. As soon as the trigger signal Vtrig is switched, the compensation signal Icalib is maintained at its last value, which allows compensating for the offset Voffs.

Step 45 represents the end of the calibration phase. The switching circuit SW_CALIB controls the switches placed at the input and output of the first amplifier COMP in order to reconnect it to the rest of the integrated circuit, and controls the switch placed between the inputs Vcomp– and Vcomp+ in order to decouple the inputs of the first amplifier COMP.

Thus, the implementation of the method allows accelerating the calibration phase in order to begin the start-up phase of the integrated circuit more quickly.

The invention claimed is:

1. A method for compensating for an internal voltage offset between a positive input and a negative input of a first operational amplifier, comprising:

coupling the negative input and the positive input of the first operational amplifier at a same voltage level;

generating a comparison current at an output of the first operational amplifier, the comparison current having a sign which is representative of a sign of the internal voltage offset;

biasing the output of the first operational amplifier to a threshold voltage with a current-to-voltage converter;

generating a control voltage, with the current-to-voltage converter, comprising a sum of the threshold voltage and a voltage conversion of the comparison current; and compensating the internal voltage offset between the positive input and the negative input of the first operational amplifier dependent on the control voltage.

2. The method according to claim 1, further comprising:

controlling a trigger element with the control voltage;

wherein the trigger element generates a trigger signal having two levels; and wherein compensating the internal offset between the positive input and the negative input of the first operational amplifier is performed until a switching of levels of the trigger signal occurs.

3. The method according to claim 1, wherein compensating the internal offset between the positive input and the negative input of the first operational amplifier comprises:

generating a compensation signal gradually and in steps successively clocked by cycles of a clock signal; transmitting the compensation signal to the first operational amplifier; and using the compensation signal to compensate for the internal voltage offset between the positive input and the negative input of the first operational amplifier.

4. The method according to claim 3, wherein generating the compensation signal comprises evolving gradually by:

an increase at each step if a difference between the control voltage and the threshold voltage has a first sign; and by a decrease at each step if the difference between the control voltage and the threshold voltage has a second sign which is opposite to the first sign.

5. The method according to claim 3, wherein a duration of each cycle of the clock signal is set according to the time of voltage conversion of the comparison current during a change of sign of the comparison current.

6. The method according to claim 1, wherein biasing the output of the first operational amplifier with the current-to-voltage converter comprises:

applying a reference voltage to a non-inverting input of a second operational amplifier; and providing a resistive feedback between the output and an inverting input of the second operational amplifier so as to bias the output of the first operational amplifier to the reference voltage.

7. An integrated circuit, comprising:

a first operational amplifier having an internal voltage offset between a positive input and a negative input; and a circuit for calibrating the internal voltage offset between the positive input and the negative input of the first operational amplifier;

wherein the circuit for calibrating comprises:

a switching circuit configured to couple the negative input and the positive input of the first operational amplifier to a same voltage level, such that the first operational amplifier is configured to generate a comparison current at an output of the first operational amplifier, wherein a sign of the comparison current is representative of a sign of the internal voltage offset on the positive input and the negative input of the first operational amplifier;

a current-to-voltage converter circuit configured to bias the output of the first operational amplifier to a threshold voltage and to generate a control voltage comprising a sum of the threshold voltage and a voltage conversion of the comparison current; and a compensation circuit configured to generate a compensation signal for compensating the internal voltage offset between the positive input and the negative input of the first operational amplifier dependent on the control voltage.

8. The integrated circuit according to claim 7, wherein the compensation circuit comprises:

a trigger element configured to generate a trigger signal having two levels;

wherein the trigger element is controlled by the control voltage; and wherein the compensation circuit is configured to generate the compensation signal until a switching of levels by the trigger signal.

9. The integrated circuit according to claim 7, wherein the compensation circuit is further configured to receive a clock signal and generate the compensation signal gradually and in steps successively clocked by cycles of the clock signal, and to transmit to the first operational amplifier the compensation signal for compensating the internal voltage offset between the positive input and the negative input of the first operational amplifier.

10. The integrated circuit according to claim 9, wherein the compensation circuit is configured to generate the compensation signal evolving gradually by:

an increase at each step if a difference between the control voltage and the threshold voltage has a first sign; and by a decrease at each step if the difference between the control voltage and the threshold voltage has a second sign opposite to the first sign.

11. The integrated circuit according to claim 10, wherein the compensation circuit is configured to be clocked by cycles of the clock signal having a duration which is set according to a time of voltage conversion of the comparison current during a sign change of the comparison current.

12. The integrated circuit according to claim 7, wherein the current-to-voltage converter comprises:

a second operational amplifier and a feedback resistor between an output and an inverting input of the second operational amplifier; and a voltage source configured to apply a reference voltage to a non-inverting input of the second operational amplifier so as to bias the output of the first operational amplifier to the reference voltage.

13. A method, comprising:

connecting a positive input and a negative input of an operational amplifier to a same voltage level, wherein the operational amplifier has an internal voltage offset;

generating a current at an output of the operational amplifier having a sign dependent on a sign of the internal voltage offset;

converting the current to a control voltage; and processing the control voltage to generate a calibration current applied to the operational amplifier to compensate for the internal voltage offset between the positive input and the negative input of the operational amplifier.

14. The method according to claim 13, further comprising:

generating a trigger signal having two levels in response to the control voltage; and wherein processing comprises adjusting the calibration current until the trigger signal switches between the two levels.

15. The method according to claim 13, wherein processing comprises adjusting the calibration current gradually and in steps successively clocked by cycles of a clock signal until there is a change in the control voltage.

16. The method according to claim 15, wherein adjusting comprises:

increasing at each step if a difference between the control voltage and a threshold voltage has a first sign; and decreasing at each step if the difference between the control voltage and the threshold voltage has a second sign which is opposite to the first sign.

17. An integrated circuit, comprising:

an operational amplifier having an internal voltage offset between a positive input and a negative input; and a circuit for calibrating the internal voltage offset between the positive input and the negative input of the operational amplifier;

wherein the circuit for calibrating comprises:

a switching circuit configured to connect the positive input and the negative input of the operational amplifier to a same voltage level;

a current to voltage converter configured to convert a current generated at an output of the operational amplifier to a control voltage; wherein the current has a sign dependent on a sign of the internal voltage offset; and a processing circuit configured to process the control voltage to generate a calibration current applied to the operational amplifier to compensate for the internal voltage offset between the positive input and the negative input of the operational amplifier.

18. The integrated circuit according to claim 17, wherein the processing circuit comprises:

a trigger element configured to generate a trigger signal having two levels in response to the control voltage; and wherein the processing circuit is configured to adjust the calibration current until the trigger signal switches between the two levels.

19. The integrated circuit according to claim 17, wherein the processing circuit is configured to adjust the calibration current gradually and in steps successively clocked by cycles of a clock signal until there is a change in the control voltage.

20. The integrated circuit according to claim 17, wherein the processing circuit adjusts by:

increasing the calibration current at each step if a difference between the control voltage and a threshold voltage has a first sign; and decreasing the calibration current at each step if the difference between the control voltage and the threshold voltage has a second sign which is opposite to the first sign.

* * * * *